US 8,053,734 B2

Nov. 8, 2011

(12) United States Patent
Kirby et al.

(10) Patent No.: US 8,053,734 B2
(45) Date of Patent: Nov. 8, 2011

(54) NANO-ANTENNA FOR WIDEBAND COHERENT CONFORMAL IR DETECTOR ARRAYS

(75) Inventors: Deborah J. Kirby, Calabasas, CA (US); David T. Chang, Calabasas, CA (US); Terence J. De Lyon, Newbury Park, CA (US); James H. Schaffner, Chatsworth, CA (US); Metin S. Mangir, Santa Monica, CA (US); Jeffery J. Puschell, Solvang, CA (US); Jar Jueh Lee, Irvine, CA (US); Michael Gritz, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 273 days.

(21) Appl. No.: 12/433,576

(22) Filed: Apr. 30, 2009

(65) Prior Publication Data

US 2010/0276598 A1    Nov. 4, 2010

(51) Int. Cl.
*G01J 5/02*    (2006.01)

(52) U.S. Cl. ............. 250/353; 250/330; 250/338.1; 438/84

(58) Field of Classification Search .......... 250/330, 250/353, 338.1; 438/84
See application file for complete search history.

(56) References Cited

U.S. PATENT DOCUMENTS

| 5,248,884 | A | 9/1993 | Brewitt-Taylor |
| 5,399,206 | A | 3/1995 | De Lyon |
| 7,289,422 | B2 | 10/2007 | Rettner et al. |
| 7,333,055 | B2 * | 2/2008 | Baharav et al. ............. 342/376 |
| 7,456,383 | B2 | 11/2008 | Kim et al. |
| 7,923,689 | B2 | 4/2011 | Kirby et al. |
| 2003/0103150 | A1 | 6/2003 | Catrysse et al. |
| 2005/0121599 | A1 | 6/2005 | Mouli |
| 2005/0200550 | A1 * | 9/2005 | Vetrovec et al. ............. 343/820 |
| 2005/0233493 | A1 | 10/2005 | Augusto |
| 2005/0275934 | A1 | 12/2005 | Ballato et al. |
| 2006/0018211 | A1 | 1/2006 | Ueyanagi et al. |
| 2006/0175551 | A1 | 8/2006 | Fan et al. |
| 2007/0194999 | A1 | 8/2007 | Morton |
| 2008/0079625 | A1 * | 4/2008 | Weems et al. ............. 342/22 |
| 2009/0108203 | A1 | 4/2009 | Gregoire et al. |

FOREIGN PATENT DOCUMENTS

GB    2348539 A    * 10/2000

OTHER PUBLICATIONS

Robert C. Keller, et al., "Reaction Chemistry and Resulting Surface Structure of HgCdTe Etched in CH4/H2 and H2 ECR Plasmas"; Journal of Electronic Materials, vol. 24, No. 9, 1995, pp. 1155-1160.

(Continued)

*Primary Examiner* — David Porta
*Assistant Examiner* — Djura Malevic
(74) *Attorney, Agent, or Firm* — Pillsbury Winthrop Shaw Pittman LLP

(57) ABSTRACT

A conformal coherent wideband antenna coupled IR detector array included a plurality of unit cells each having a dimension that includes an antenna for focusing radiation onto an absorber element sized less than the dimension. In one embodiment, the absorber element may be formed of a mercury cadmium telluride alloy. According to a further embodiment, the antenna array may be fabricated using sub-wavelength fabrication processes.

13 Claims, 5 Drawing Sheets

OTHER PUBLICATIONS

Robert C. Keller, et al., "Dry Etching of Hg1-xCdTe Using CH4/H2/Ar/N2 Electron Cyclotron Resonance Plasmas"; Journal of Electronic Materials, vol. 25, No. 8, 1996, pp. 1270-1275.

J.D. Benson, et al., "The Influence of Photoresist Feature Geometry on ECR Plasma Etched HgCdTe Trenches"; Materials for Infrared Detectors II, Proceedings of SIPE, vol. 4795, 2002, pp. 129-135.

Andrea Neto, et al., ""Infinite Bandwidth" Long Slot Array Antenna"; IEEE Antennas and Wireless Propagation Letters, vol. 4, 2005, pp. 75-78.

International Search Report/Written Opinion dated Jun. 4, 2010 of PCT/US2010/024169 filed Feb. 12, 2010 (13 pages).

Gonzalez et al., "Two Dimensional Array of Antenna-Coupled Mircrobolometers", Intl. J. Infrared & Millimeters Waves, vol. 23, No. 5, pp. 785-797 (2002).

Huifeng et al., "Optical antennas: A boost for infrared detection", J. Vacuum Sci. & Technol.: Part B., AVS/AIP, nvol. 26, No. 6, pp. 2156-2159 (2008).

Siliquini et al., "Two-Demensional Infrared Focal Plane Arrays Based on HGCDTE Photoconductive Detectors", Semiconductor Science and Technology, vol. 11, No. 12, pp. 1906-1911 (1996).

\* cited by examiner

NANO-ANTENNA FOR WIDEBAND COHERENT CONFORMAL IR DETECTOR ARRAYS

BACKGROUND

This application generally relates to IR detectors, and in particular, to a nano-antenna coupled IR detector array.

Imaging systems typically use an array of detectors to generate an image of a target. Each individual detector element measures the intensity of energy (such as infrared or visible light) incident upon the detector element, and is used to form one pixel of the output image.

Present infrared (IR) detection systems employ bulky, complex, opto-mechanical systems using incoherent, direct detection IR arrays that require cryogenic cooling. Size, mass, power and packaging constraints of sensors impact platforms and ultimately limits performance. Complexity increases cost and reduces reliability.

GaN and GaAs/AlGaAs quantum well infrared photodetector (QWIP) technologies have been considered for broad band long-wavelength infrared (LWIR) response. However, the quantum efficiency at 10 µm for these systems is significantly low as they require extrinsic doping.

SUMMARY

According to embodiment, a wideband infrared (IR) antenna array includes: a plurality of unit cells, each of the unit cells comprising: an antenna that focuses IR radiation onto an associated IR absorber element, each unit cell having a dimension approximately that of the wavelength detected that includes the antennae therein, wherein the absorber element is sized less than the dimension.

According to another embodiment, a method of forming an infrared (IR) wideband antenna array includes: epitaxially growing an IR absorber material on a substrate; forming a plurality of mesas in the absorber material; depositing an oxide layer between the mesas; and forming connected dipoles antennas over the oxide layer, wherein the connected dipole antennas are sized so as to have a response characteristic in the IR spectrum.

Other features and advantages of one or more embodiments of the present application will seem apparent from the following detailed description, and accompanying drawings, and the appended claims.

BRIEF DESCRIPTION OF THE DRAWINGS

Embodiments of the present application will now be disclosed, by way of example only, with reference to the accompanying schematic drawings in which corresponding reference symbols indicate corresponding parts, in which.

DETAILED DESCRIPTION

A coherent infrared (IR) imaging system is disclosed. In particular, radio frequency (RF) analogs for wideband emission and reception may be adapted for use at optical wavelengths, such as infrared (IR) spectrum. Scaling the RF technology down to IR wavelengths represents a breakthrough for IR imaging technology, providing high performance lenseless detection for next generation large format coherent imaging systems that are platform conformal and scalable to large areas.

According to one embodiment, an array of planar low profile antennas are provided which focus incoming radiation below the diffraction limit thereby enabling the implementation of sub-wavelength dimension detectors. In some aspects, this antennae array configuration may be thought of as the conjugate of the long slot RF antenna approach described, for example, by A. Neto and J. J. Lee "Infinite Bandwidth" "Long Slot Array Antenna" IEEE Antennas and Wireless Propagation Letters Vol. 4 (2005) p. 75.

Figure 1:
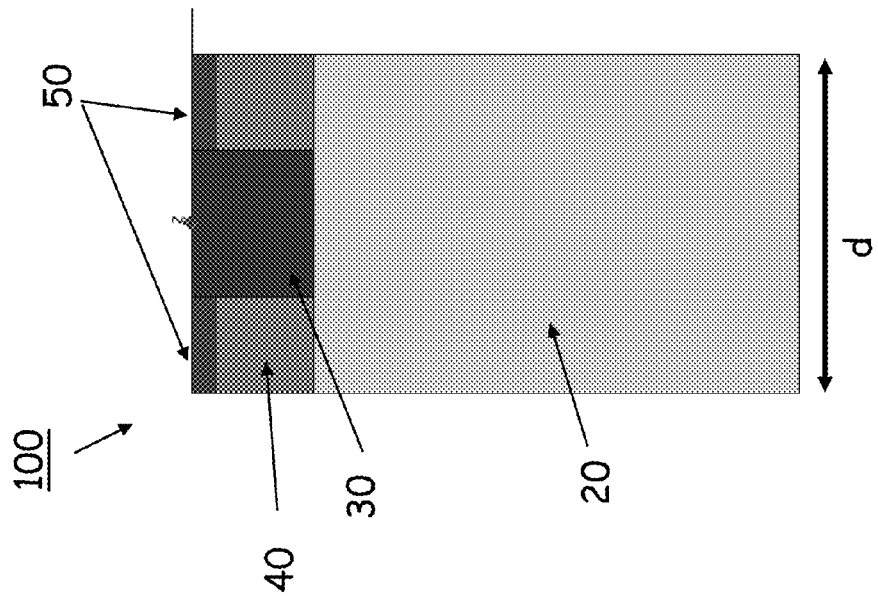
FIG. 1 shows an exemplary unit cell for a nano-antenna array, according to an embodiment of the disclosure.

FIG. 1 shows an exemplary unit cell schematic for a nano-antenna coupled IR detector array, in accordance with an embodiment. Unit cell 100 may have a generally rectangular (or square) cross-section having a dimension d. In one implementation, the dimension d may be between 4-10 µm for an IR application.

Unit-cell 100 generally includes substrate 20 having absorbing elements 30, separately spaced by insulating elements 40, each having a dipole antenna 50. In one implementation, metal diploes 50 may be configured to provide a wideband response over 8-12 µm. Absorbing elements 30 may be configured to absorb light, for example, in the infrared spectrum. In one implementation, the absorbing elements 30 may be formed of mercury cadmium telluride (also known as "mercad telluride," MCT or HgCdTe).

An array of unit cells 100 may be used to generate an image of a target, with each unit cell 100 forming a pixel element. Absorber 30 measures the intensity of energy incident upon the pixel element, and this measurement is then used to form one pixel of the output image.

Figure 2:
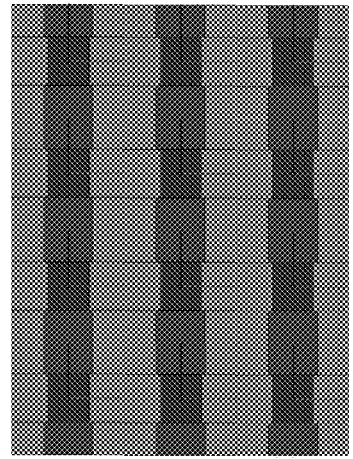
FIG. 2 shows a top view of the unit cell shown in FIG. 1.

FIG. 2 shows a schematic top view of unit cell 100 shown in FIG. 1. As will be appreciated, the planar array may extend in both the x- and y-directions. Dipoles 50 respond to polarization lying along the length of the dipoles.

Light (radiation) will illuminate unit cell 100 from the top side of unit-cell 100. A portion of the incident light will be received by dipoles 50 which create a resonance current therein. The resonance currents in dipole 50 help to focus the incident radiation down to sub-wavelength dimensions, which maybe received by IR absorbing elements 30: Because of this configuration, dipoles 50 are configured to collect energy incident on an area, much larger than the area of absorber 30, and to focus that energy into a smaller, localized area where absorbing element 30 is positioned. This allows use of absorbing elements 30 that are much smaller than the pixel area (i.e., the dimension d). Since absorber elements 30 are smaller than the pixel area, a greater signal to noise ratio may be realized. Also, this allows for operation of the detector array either uncooled, or at a higher operating temperature. The size of dipoles 50 is constrained, not with respect to the absorber size, but to the absorber periodicity. In one embodiment, absorbers 30 may be separated by approximately λ/2. For wavelengths of 8-12 µm, this spacing would be about 4-6

μm. In the single cell view, shown in FIG. 2, each dipole wing represents approximately one-half of the dipole length. Thus, the length of the half dipoles 50, for example, may be about 2-3 μm.

Dipoles 50 may be resistively connected through absorber elements 30. In particular, photons impinging on absorber elements 30 may be optically mixed to provide an intermediate frequency signal. In one implementation, a local oscillator (such as a laser) provides an intermediate frequency signal in the 1-20 GHz range. Current amplitude and phase can then be detected from each pixel at this intermediate frequency.

Figure 3:
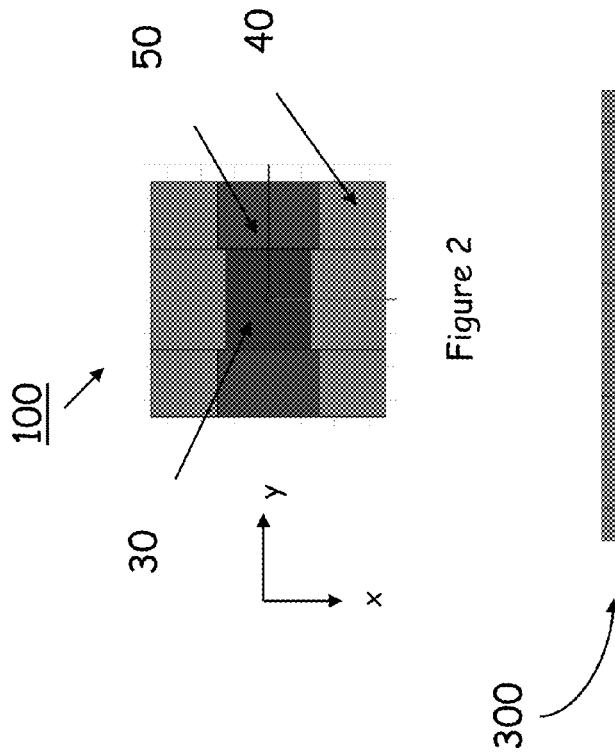
FIG. 3 shows a top view of an array of unit cells shown in FIG. 1.

FIG. 3 shows a top view of array 300 of unit cell antennae 100 shown in FIG. 1. Array 300 includes a plurality of unit cells 100 (pixel elements) joined to together to form a one or two dimensional array. In one embodiment, a 100×100 array antenna may be provided. As can be seen, adjacent dipoles 50 may be resistively connected in rows forming a planar coherent wideband array IR detector array (although this need not be the case).

According to an aspect of the disclosure, the antenna array may be fabricated using sub-wavelength fabrication processes.

Figure 4:
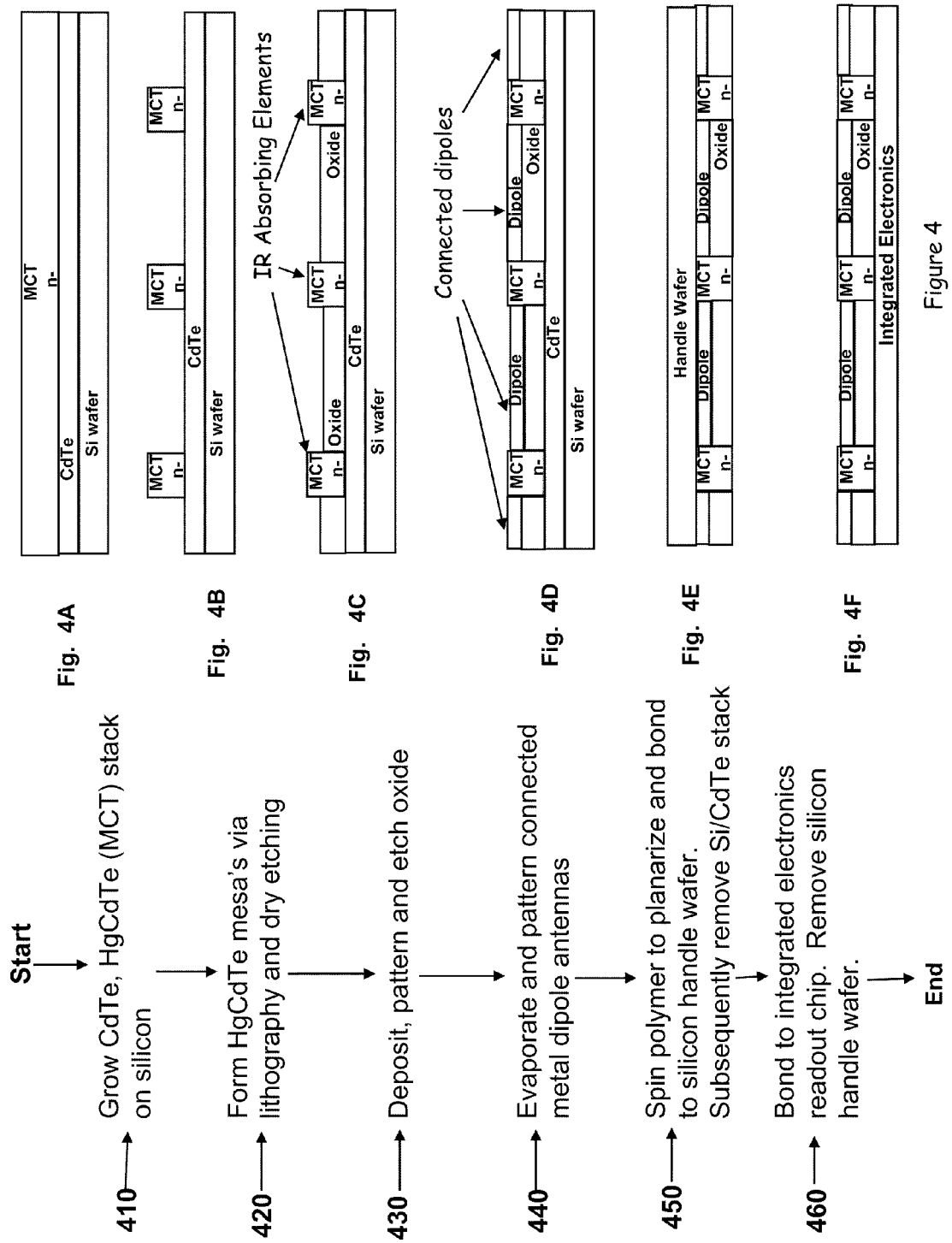
FIG. 4 shows an exemplary method for fabricating a nano-antenna array, according to an embodiment of the disclosure.

FIG. 4 shows an exemplary fabrication process 400 for forming a nano-antenna coupled IR detector array, in accordance with an embodiment.

Beginning in Step 410 (FIG. 4A), an IR absorbing semiconductor material may be epitaxially grown on a silicon wafer. In one embodiment, a II-VI ternary alloy semiconductor such as mercad telluride $Hg_{(1-x)}Cd_xTe$ may be provided.

In order to build the MCT layer up on the silicon wafer, fabrication may commence with epitaxial growth of an intermediate cadmium telluride (CdTe) layer on a single crystal silicon wafer. A 7 μm thick CdTe layer provides lattice matching between the silicon wafer and a 2-3 μm thick IR absorbing $Hg_{(1-x)}Cd_xTe:n^-$ layer.

The absorption cut-off wavelength of the MCT may be selectively "tuned" by varying the alloy composition, for example, as disclosed in the co-pending application entitled "MULTIBAND SUB-WAVELENGTH IR DETECTOR HAVING A FREQUENCY SELECTIVE SLOTS AND METHOD OF MAKING THE SAME," application Ser. No. 12/433,631, filed concurrently with this disclosure on Apr. 30, 2009, and issued on Apr. 12. 2011 as U.S. Pat. No. 7,923, 689, herein incorporated by reference in its entirety. For example, the MCT band gap may be selectively tuned to absorb radiation between 8-12 μ.

A direct band gap of 0.1 eV, appropriate for 8-12 μm absorption may be obtained using an alloy composition of MCT where x is about 0.2. Electron mobility of $\mu_e=10^4$ cm$^2$/V-s for $Hg_{(1-x)}Cd_xTe$ may be sufficiently fast for detection at an intermediate frequency (IF) of 1-20 GHz.

Next, in step 420 (FIG. 4B), sub-wavelength absorber mesas may be patterned via lithography techniques and formed by dry etching the MCT layer $Hg_{(1-x)}Cd_xTe: n^-$ layer. Dry etching processes which may be adapted for use are described, for example, by R. C. Keller et. al. "Reaction Chemistry and Resulting Surface Structure of HgCdTe Etched in CH$_4$/H$_2$ and H$_2$ ECR Plasmas" J. Electron. Mater. 24, 1155 (1995); R. C. Keller et. al. "Dry Etching of $Hg_{1-x}Cd_xTe$ Using CH$_4$/H$_2$/Ar/N$_2$ Electron Cyclotron Resonance Plasmas" J. Electron. Mater. 25, 1270 (1996); and J. D. Benson et. al. "The Influence of Photoresist Feature Geometry on ECR Plasma Etched HgCdTe Trenches" SPIE vol. 4795 (2002) p. 129, which are herein incorporated by reference in their entirety.

In one implementation, the sub-wavelength mesas may be dry etched to a volume of approximately $L^3$. Current manufacturing techniques permit L to be approximately 2-3 μm, although efforts are underway for L to be about 1 μm. The benefit of sub-wavelength absorber dimensions is that detector noise is reduced by virtue of the smaller area, however the antenna structure focuses radiation from a larger unit cell area onto the smaller absorber elements. The term "sub-wavelength," as used herein, means a dimension that is less than the incoming radiation wavelength.

In step 430 (FIG. 4C), an insulating layer may be deposited next and patterned around the mesas to provide isolation between the dipoles and the CdTe layer. In one implementation, the insulating layer may be silicon oxide (SiO$_2$). This insulating layer may be formed by an oxide deposition process, for example, by a plasma-enhanced chemical vapor deposition (PECVD) process over the entire surface. More particularly, the region may be patterned and the oxide is etched resulting in periodic areas of isolation.

In step 440 (FIG. 4D), the metallic dipoles may be formed over the oxide. For example, gold (Au) may be subsequently evaporated and patterned over the oxide to connect the metal dipole antennas. In one embodiment, the oxide thickness may be approximately 0.55 μm and the dipole thickness may be approximately 0.1 μm. Thus, a generally planar top surface may be formed.

In step 450 (FIG. 4E), a spin on polymer planarization step follows on top of the dipole array to produce a flat top surface profile for attaching a silicon handle wafer. Once the silicon handle wafer is bonded in place, the backside silicon wafer can be removed by dry etching techniques. The CdTe layer is then removed using standard selective etching techniques.

In step 460 (FIG. 4F), the antenna array may be bonded to a readout circuit, such as an integrated circuit, using a reduced footprint bonding processes. Through this circuit, ohmic contact is provided to individual absorbing elements 30 of the array. The silicon handle wafer may be later removed using dry etching to complete the wideband IR sensor array.

For a detector element area A of approximately 3.3×3.3 μm$^2$, the RC time constant for the device may be approximately $1.6 \times 10^{-13}$ s, indicating that a response frequency of around $1/2\pi$ RC is approximately 1 THz. It may be assumed that incident IR signal may be mixed with a local oscillator in the MCT absorber element, to generate a 1-20 GHz IF.

Figure 5:
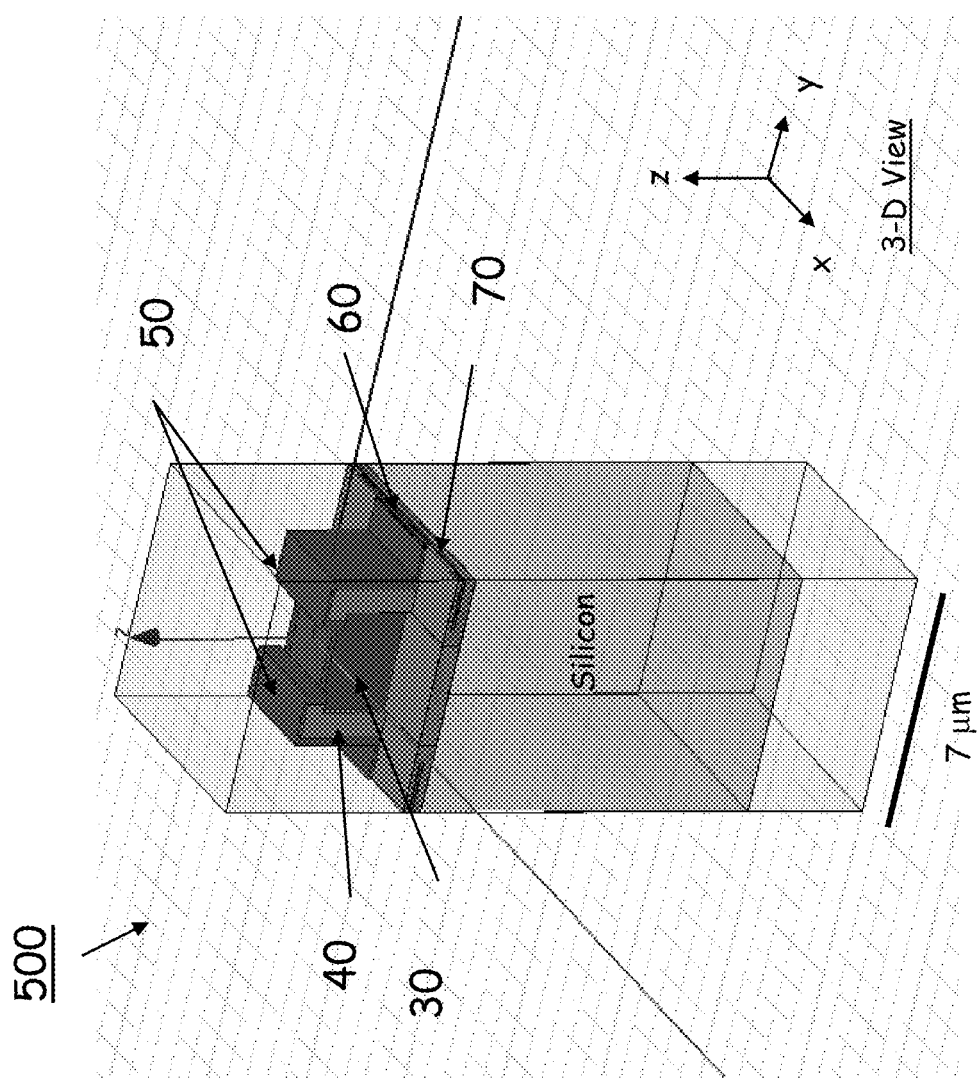
FIG. 5 shows a schematic of a nano-antenna unit cell that was used by the inventors for diagnostic testing purposes, according to an embodiment of the disclosure.

FIG. 5 shows a schematic of a nano-antenna array having a unit cell 500 that was used by the inventors for diagnostic testing purposes. The array was simulated using a high frequency structural simulator (HFSS) technique. The nano-antenna unit cell 500 has a periodicity of d=7 μm. The sidewalls of the dipole antenna are formed so as to cover the PECVD oxide profile.

Figure 6:
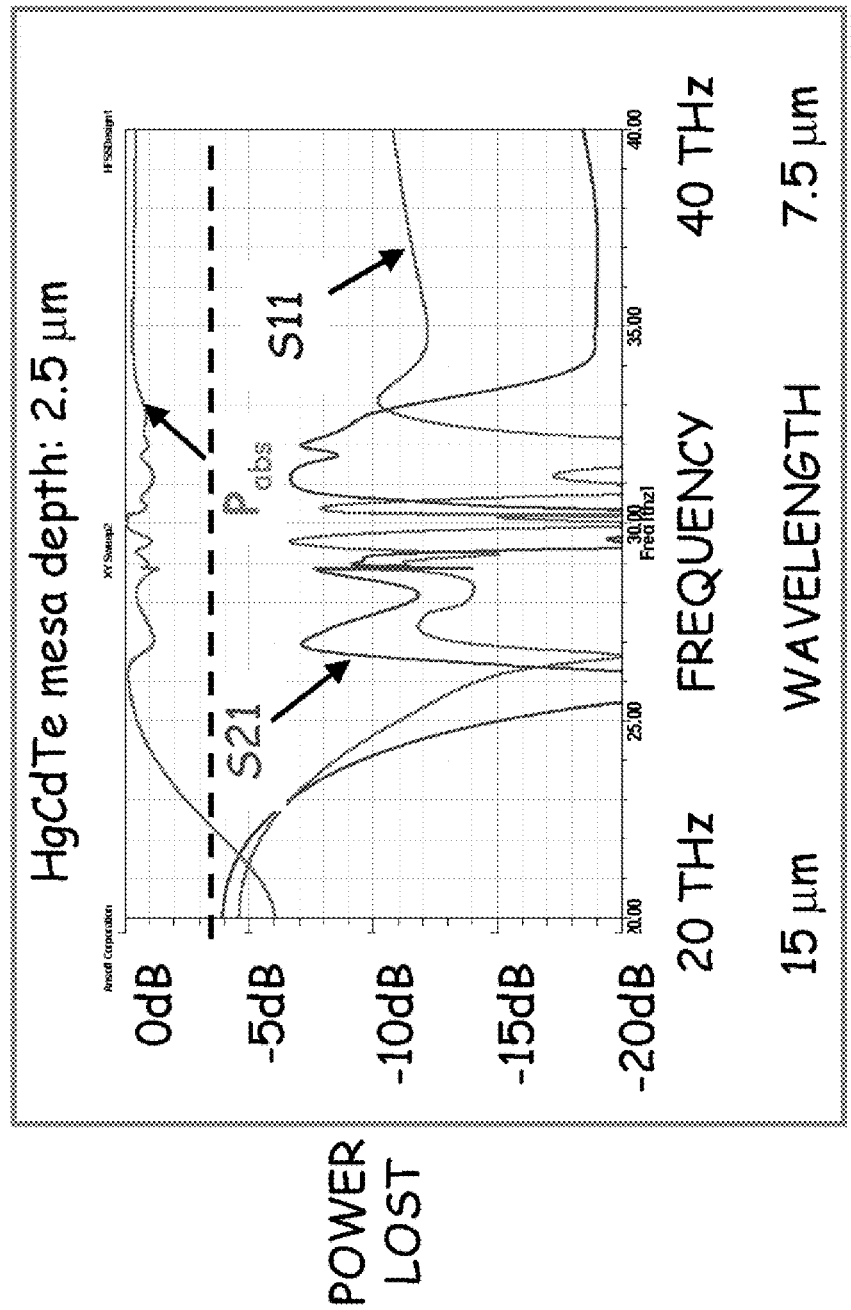
FIG. 6 shows a plot of the S-parameters and power lost for an infinite array of unit cells, according to an embodiment of the disclosure.

FIG. 6 shows results of HFSS simulations that demonstrate the potential for wideband response for infinite array of nano-antenna coupled IR detectors having a unit cell size d of 7 μm. The array has a −3dB bandwidth of greater than 17 THz over which the absorbed power is a maximum. Absorbed power is defined as $P_{abs}=1-|S11|^2-|S21|^2$. The S-parameters, S11 and S21, show that reflection and transmission are a minimum over this range. Material parameters used in these simulations are complex values at 10 μm. See, e.g., "Handbook of Optical Constants of Solids I, II & III," by Edward T Palik. Academic Press, 1998. For the case of HgCdTe, $\epsilon'=12.53$, loss tangent=$2.82\times10^{-4}$, and conductivity $\sigma=500$-$1000$ S/m.

Figure 7:
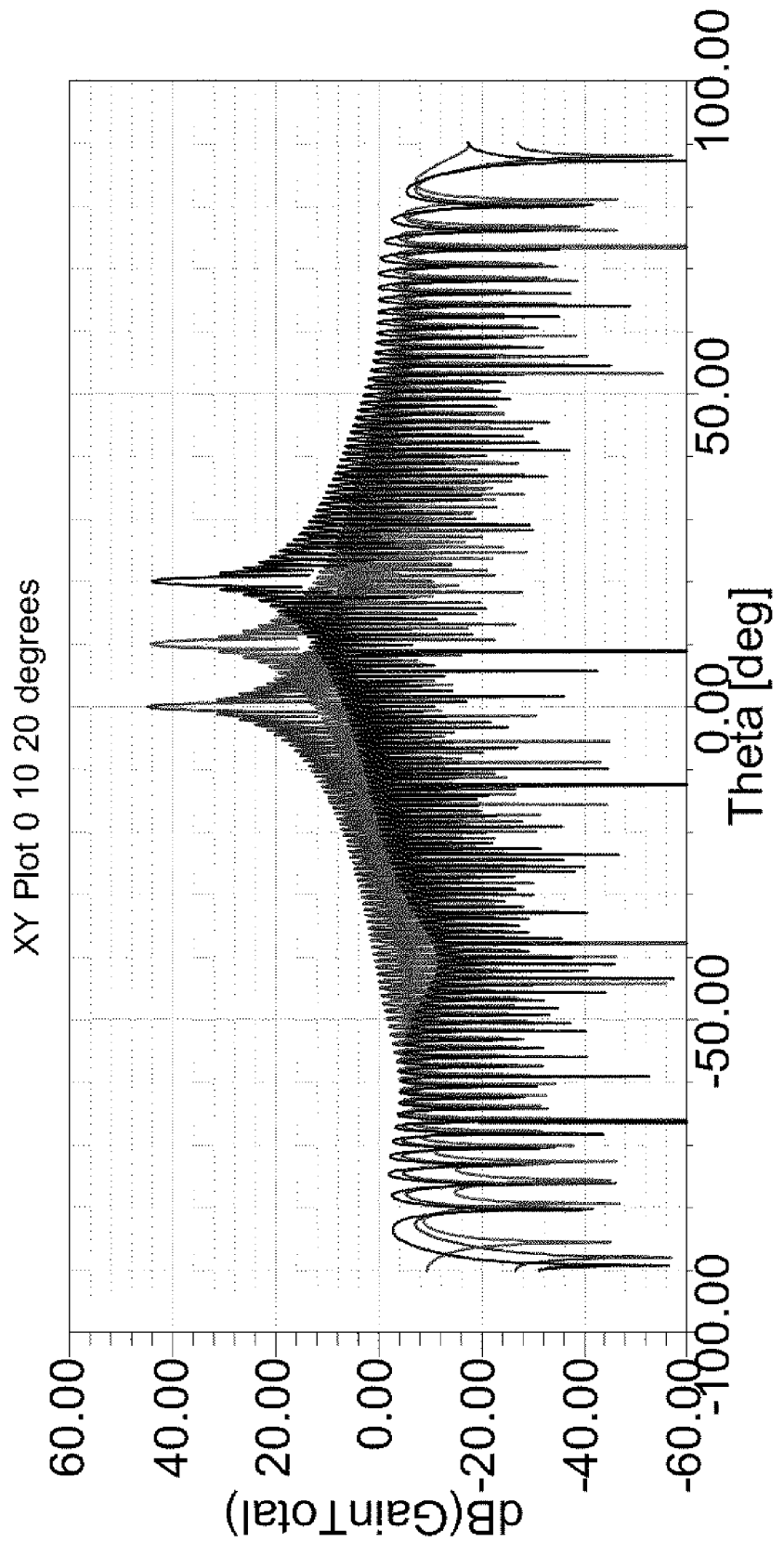
FIG. 7 shows the radiation pattern for a 100×100 array of nano-antennas, according to an embodiment of the disclosure.

FIG. 7 presents an HFSS simulated radiation pattern for a 100×100 element array, according to an embodiment. Three plots are shown which corresponding to broadside beam steering over 0, 10 and 20 degrees.

As can be seen, a −3dB bandwidth of 0.72 degrees and a peak gain of 44.8 dB may be realized. Theoretical calculations predicted a bandwidth of 0.73 degrees and a peak gain of 48 dB.

Space, airborne and surface-based infrared and visible imaging and remote sensing systems may benefit from this conformal nano-technology as it would result in higher performance, more producible infrared-visible imagers that are easier to integrate and deploy.

The antenna array provides a much higher signal to noise ratio than conventional systems, especially at higher temperatures. Moreover, the antenna array may be uncooled, although cooling may improve signal to noise ratio of the antennas. When cooled, less cooling may be required as compared to conventional IR detector array.

The embodiments disclosed herein may be adapted for other spectra, such as for example, visible or UV. However, since wavelengths are shorter in the visible and UV spectra the dimensions of the detector array would be smaller.

While this disclosure has been described in connection with what is presently considered to be the most practical embodiment, it is to be understood that it is capable of further modifications and is not to be limited to the disclosed embodiments, and this application is intended to cover any variations, uses, equivalent arrangements or adaptations of the disclosure following, in general, the principles of the disclosure and including such departures from the present disclosure as come within known or customary practice in the art to which the application pertains, and as may be applied to the essential features hereinbefore set forth and followed in the spirit and scope of the appended claims.

What is claimed is:

1. A wideband infrared (IR) detector array comprising:
   a plurality of unit cells, each of said unit cells forming a pixel comprising:
      a dipole antenna having a pair of antenna arms configured to focus IR radiation; and
      a single IR absorber element associated with the dipole antenna and configured to receive the focused IR radiation from the associated dipole antenna;
   wherein the plurality of unit cells abut each other such that a separation between the IR absorber elements of each unit cell is approximately that of half a wavelength detectable by each dipole antenna;
   wherein the IR absorber elements of adjacent ones of the plurality of unit cells share a common arm of the pair of antenna arms; and
   wherein the dipole antennas of the plurality of unit cells are resistively coupled through the IR absorber elements across the array such that the array receives a wider number of wavelengths than is detectable by any one unit cell, and thereby provides a greater bandwidth for the array than for said any one unit cell.

2. The wideband IR detector array according to claim 1, wherein the unit cells are arranged as a linear array.

3. The wideband IR detector array according to claim 1, wherein the unit cells are arranged as a planar array.

4. The wideband IR detector array according to claim 1, wherein the associated IR absorber element comprises mercad telluride alloy.

5. The wideband IR detector array according to claim 4, wherein the mercad telluride alloy comprises $Hg_{(1-x)}Cd_xTe$, and x is about 0.2.

6. The wideband IR detector array according to claim 1, wherein said separation is between 4-10 μm.

7. The wideband IR detector array according to claim 1, further comprising a circuit bonded to the backside of the array.

8. A method of forming an infrared (IR) wideband antenna array, the method comprising:
   epitaxially growing an IR absorber material on a substrate;
   forming a plurality of mesas in the absorber material;
   depositing an oxide layer between the mesas; and
   forming dipole antenna arms over the oxide layer, wherein adjacent mesas of absorber material share one of the dipole antenna arms, such that the dipole antenna arms are resistively coupled through the mesas across the array such that the array receives a wider number of wavelengths than is detectable by any one unit cell and thereby provides a greater bandwidth for the array than for said any one unit cell.

9. The method according to claim 8, further comprising:
   bonding a circuit to the bottom of the absorber material.

10. The method according to claim 8, wherein the absorber material comprises mercad telluride.

11. The method according to claim 10, further comprising:
   forming an intermediate layer of cadmium telluride over the substrate before growing the mercad telluride thereon.

12. The method according to claim 10, wherein the mercad telluride comprises $Hg_{(1-x)}Cd_xTe$, and x is about 0.2.

13. The method according to claim 8, further comprising:
   bonding an intermediate wafer on a top surface of the IR absorber materials and dipoles for further processing; and
   removing the substrate and intermediate layers.

* * * * *